US010103138B2

(12) United States Patent
Zhai et al.

(10) Patent No.: US 10,103,138 B2
(45) Date of Patent: Oct. 16, 2018

(54) DUAL-SIDED SILICON INTEGRATED PASSIVE DEVICES

(71) Applicant: Apple Inc., Cupertino, CA (US)

(72) Inventors: Jun Zhai, San Jose, CA (US); Vidhya Ramachandran, Cupertino, CA (US); Kunzhong Hu, Cupertino, CA (US); Mengzhi Pang, Cupertino, CA (US); Chonghua Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/658,670

(22) Filed: Jul. 25, 2017

(65) Prior Publication Data

US 2017/0323883 A1 Nov. 9, 2017

Related U.S. Application Data

(63) Continuation of application No. 15/057,588, filed on Mar. 1, 2016, now Pat. No. 9,748,227.

(Continued)

(51) Int. Cl.

| | |
|---|---|
| ***H01L 27/08*** | (2006.01) |
| ***H01L 27/06*** | (2006.01) |
| ***H01L 21/77*** | (2017.01) |
| ***H01L 49/02*** | (2006.01) |
| ***H01L 23/64*** | (2006.01) |
| ***H01L 23/00*** | (2006.01) |
| ***H01L 25/16*** | (2006.01) |

(Continued)

(52) U.S. Cl.

CPC .......... *H01L 27/0641* (2013.01); *H01L 21/77* (2013.01); *H01L 23/642* (2013.01); *H01L 23/645* (2013.01); *H01L 24/19* (2013.01); *H01L 24/20* (2013.01); *H01L 25/16* (2013.01); *H01L 28/10* (2013.01); *H01L 28/40* (2013.01); *H01L 28/90* (2013.01); *H01L 2224/04105* (2013.01); *H01L 2224/12105* (2013.01); *H01L 2224/24195* (2013.01); *H01L 2924/18162* (2013.01);

(Continued)

(58) Field of Classification Search

CPC combination set(s) only.
See application file for complete search history.

(56) References Cited

U.S. PATENT DOCUMENTS 6,153,290 A * 11/2000 Sunahara ............ H01L 21/4857 156/89.16
6,724,638 B1 4/2004 Inagaki (Continued)

*Primary Examiner* — Tram H Nguyen

(74) *Attorney, Agent, or Firm* — Meyertons, Hood, Kivlin, Kowert & Goetzel, P.C.; Neal E. Persky; Lawrence J. Merkel

(57) ABSTRACT

In some embodiments, a system may include an integrated circuit. The integrated circuit may include a substrate including a first surface, a second surface substantially opposite of the first surface, and a first set of electrical conductors coupled to the first surface. The first set of electrical conductors may function to electrically connect the integrated circuit to a circuit board. The integrated circuit may include a semiconductor die coupled to the second surface of the substrate using a second set of electrical conductors. The integrated circuit may include a passive device dimensioned to be integrated with the integrated circuit. The passive device may be positioned between the second surface and at least one of the first set of electrical conductors. The die may be electrically connected to a second side of the passive device. A first side of the passive device may be available to be electrically connected to a second device.

14 Claims, 6 Drawing Sheets

100
140
110
140
150
130
150
120
160

Related U.S. Application Data

(60) Provisional application No. 62/192,766, filed on Jul. 15, 2015.

(52) U.S. Cl.
CPC ............... *H01L 2924/19041* (2013.01); *H01L 2924/19042* (2013.01); *H01L 2924/19105* (2013.01)

(56) References Cited

U.S. PATENT DOCUMENTS 7,307,852 B2 12/2007 Inagaki
7,365,438 B2 4/2008 Hedler
7,889,509 B2 2/2011 Urashima
9,030,002 B2 5/2015 Lin
2004/0012085 A1 1/2004 Shioga
2007/0085200 A1 4/2007 Lu
2007/0257761 A1* 11/2007 Mano ................. H01F 17/0006 336/200
2009/0056987 A1 3/2009 Nomiya
2009/0212391 A1* 8/2009 Carobolante ......... H01L 23/642 257/531
2009/0215231 A1 8/2009 Inoue
2011/0170231 A1 7/2011 Chandrasekaran
2012/0153493 A1 6/2012 Lee
2014/0070422 A1 3/2014 Hsiao et al.
2014/0134801 A1 5/2014 Chen et al.
2015/0028448 A1 1/2015 Hosseini et al.

* cited by examiner

DUAL-SIDED SILICON INTEGRATED PASSIVE DEVICES

PRIORITY CLAIM

This application is continuation of U.S. patent application Ser. No. 15/057,588 entitled "DUAL-SIDED SILICON INTEGRATED PASSIVE DEVICES" filed on Mar. 1, 2016, which claims priority to U.S. Provisional Patent Application No. 62/192,766 entitled "DUAL-SIDED SILICON INTEGRATED PASSIVE DEVICES" filed on Jul. 15, 2015, all of which is incorporated by reference herein.

BACKGROUND

Technical Field

Embodiments described herein relate to semiconductor devices and methods for semiconductor device design. More particularly, some embodiments disclosed herein relate to integrated circuits including dual-sided silicon integrated passive devices.

Description of the Related Art

Integrated passive devices (IPDs) include silicon die that carry passive devices such as capacitors and inductors for integration into a circuit system. Similar to all other silicon chips, these are typically built on one side of a silicon wafer. An active surface of the IPD contains all interconnects necessary for connecting from the outside world to the passive device on the chip.

For example, FIG. 1 is a block diagram illustrating an embodiment of a current integrated circuit 100 including an integrated passive device 110. Typical integrated circuit 100 includes die 120 coupled to a redistribution layer 130 (RDL) and a first set of electrical conductors 140 coupled to the RDL on a side opposing the coupled die. The RDL 130 may include conductors 150 coupling the die 120 and/or the IPD 110 to the first set of electrical conductors 140. The integrated circuit may include an encapsulant 160 formed from an insulating material. The IPD 110 may be coupled to a substrate (e.g., RDL 130), through a single side of the IPD, adjacent die 120 (e.g., as depicted in FIG. 1). The IPD 110 may also be coupled to a substrate (e.g., RDL 130), through a single side of the IPD, on a side opposite the side the die 120 is coupled to the substrate (e.g., as depicted in FIG. 2). The IPD having electrical conductors on only one side of the passive device may limit the design options.

SUMMARY

In some embodiments, a system may include an integrated circuit. The integrated circuit may include a substrate including a first surface, a second surface substantially opposite of the first surface, and a first set of electrical conductors coupled to the first surface. The first set of electrical conductors may function to electrically connect the integrated circuit to a circuit board. The integrated circuit may include a semiconductor die coupled to the second surface of the substrate using a second set of electrical conductors. The integrated circuit may include a passive device dimensioned to be integrated with the integrated circuit. The passive device may be positioned to between the second surface and at least one of the first set of electrical conductors. The die may be electrically connected to a second side of the passive device. A first side of the passive device may be available to be electrically connected to a second device.

BRIEF DESCRIPTION OF THE DRAWINGS

The following detailed description makes reference to the accompanying drawings, which are now briefly described.

Figure 1:
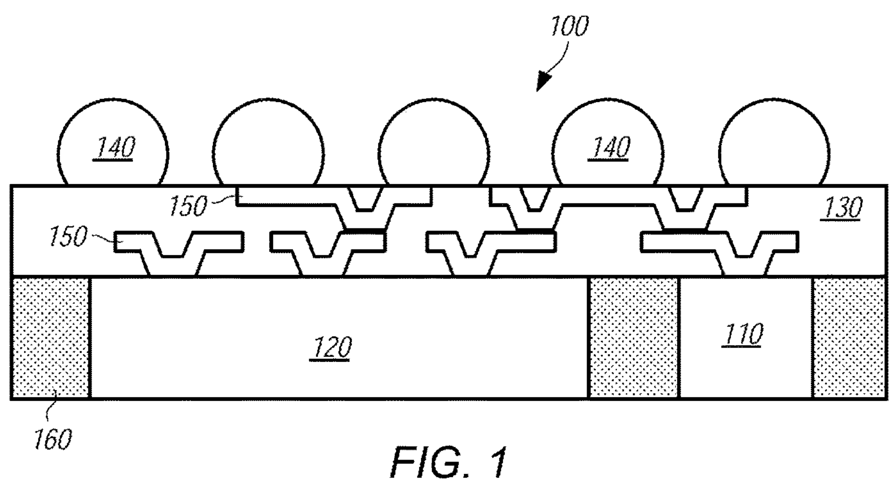
FIG. 1 is a block diagram illustrating an embodiment of a current integrated circuit including an integrated passive device.
Figure 2:
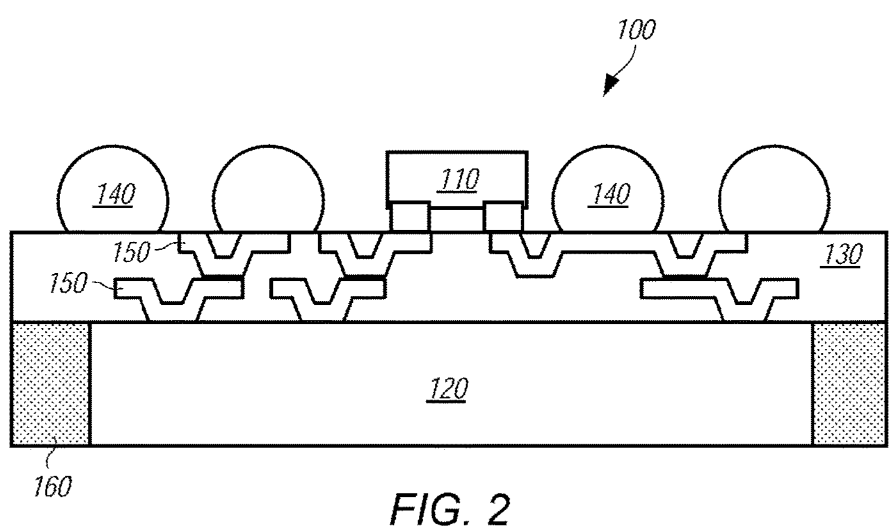
FIG. 2 is a block diagram illustrating an embodiment of a current integrated circuit including an integrated passive device.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

Definitions

Unless defined otherwise, all technical and scientific terms used herein have the same meaning as commonly understood by one of ordinary skill in the art.

The term "connected" as used herein generally refers to pieces which may be joined or linked together.

The term "coupled" as used herein generally refers to pieces which may be used operatively with each other, or joined or linked together, with or without one or more intervening members.

The term "directly" as used herein generally refers to one structure in physical contact with another structure, or, when used in reference to a procedure, means that one process effects another process or structure without the involvement of an intermediate step or component.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

For decades a race has been run to make integrated circuits not only more efficient but smaller. Integrated circuits have consistently migrated to smaller feature sizes over the years, allowing more circuitry to be packed on each chip. This increased capacity per unit area can be used to decrease cost and/or increase functionality. Typically, as the feature size shrinks the cost per unit and the switching power consumption go down, and the speed goes up. Problematically, integrated circuits with nanometer-scale devices are not without their problems.

Typically passive devices need to be placed between different components in a system. As the physical systems are reduced, there can be great advantage and flexibility to system design if the IPD has contacts on both sides of the chip. The IPD footprint can be reduced, and the series resistances to connect to the passives can be significantly reduced or controlled.

Figure 3:
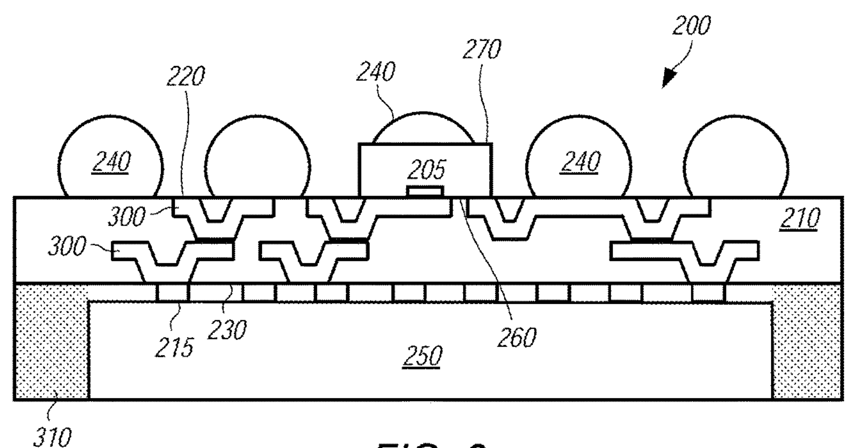
FIG. 3 is a block diagram illustrating an embodiment of an integrated circuit including a double-sided integrated passive device.
Figure 4:
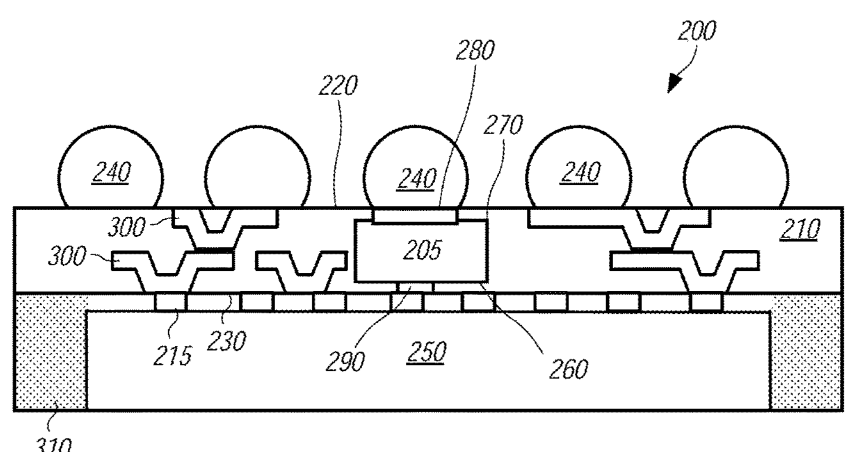
FIG. 4 is a block diagram illustrating an embodiment of an integrated circuit including a double-sided integrated passive device.

In some embodiments, a method and/or a system may include an integrated circuit 200. FIGS. 3-4 are block diagrams illustrating an embodiment of an integrated circuit 200 including a double-sided integrated passive device 205. The integrated circuit 200 may include a substrate 210 including a first surface 220, a second surface 230 substantially opposite of the first surface, and a first set of electrical conductors 240 coupled to the first surface. The first set of electrical conductors 240 may function to electrically connect the integrated circuit to a circuit board (not depicted in FIGS. 3-4). The integrated circuit 200 may include a semiconductor die 250 coupled to the second surface 230 of the substrate 210 using a second set of electrical conductors 215.

Substrate 210 may include materials such as, but not limited to, glass fiber, PPG, ABF, PI (polyimide), PBO (polybenzoxazole), BCB (benzocyclobutene), and WPRs (wafer photo resists such as novolak resins and poly(hydroxystyrene) (PHS) available commercially under the trade name WPR including WPR-1020, WPR-1050, and WPR-1201 (WPR is a registered trademark of JSR Corporation, Tokyo, Japan)). Substrate 210 may be formed using techniques known in the art (e.g., techniques used for polymer deposition).

Substrate 210 may include one or more layers of wires or routing. In certain embodiments, the substrate 210 may include two or more layers of wiring or routing. The routing may be, for example, copper wiring or another suitable electrical conductor wiring. A thickness of the substrate 210 may depend on the number of layers of routing in the substrate. For example, each layer of routing may be between about 5 μm and about 10 μm in thickness. In certain embodiments, substrate 210 may have a thickness of at least about 5 μm and at most about 150 μm.

The electrical connectors discussed herein may include metal balls or pillars (e.g., copper, gold, tin, tin/gold, tin/silver, tin/copper, tin/silver/copper), metal plates, or a mesh design (e.g., a crisscrossing trace pattern forming a grid pattern).

In some embodiments, the integrated circuit 200 may include a passive device 205. The passive device 205 may be dimensioned to be integrated with the integrated circuit. The passive device may be positioned between the second surface 220 and at least one of the first set of electrical conductors 240. In some embodiments, a second side 260 of the passive device 205 may be coupled or directly attached to the first surface 220 of the substrate 210 (e.g., as depicted in FIG. 3). In some embodiments, the passive device 205 may be positioned in the substrate 210 (e.g., as depicted in FIG. 4 in for example a trench or opening).

At least one of the first set of electrical conductors 240 may be directly attached (e.g., as depicted in FIG. 3) or coupled (e.g., as depicted in FIG. 4) to the first side 270 of the passive device 205.

In some embodiments, the passive device 205 may include at least a third electrical conductor 280 positioned on the first side 270 of the passive device 205. The passive device 205 may include at least a fourth electrical conductor 290 positioned on the second side 260 of the passive device 205. The second side 260 of the passive device 205 may be positioned opposite the first side 270 of the passive device 205. The die 250 may be electrically connected to the fourth electrical conductor 290 using the second set of electrical conductors 215. The third electrical conductor 280 may be available to be electrically connected to a second device (not depicted) using at least one of the first set of electrical conductors.

The substrate 210 may include conductors 300 coupling the die 250 and/or the IPD 205 to the first set of electrical conductors 240. The integrated circuit 200 may include an encapsulant 310 formed from an insulating material.

Figure 5:
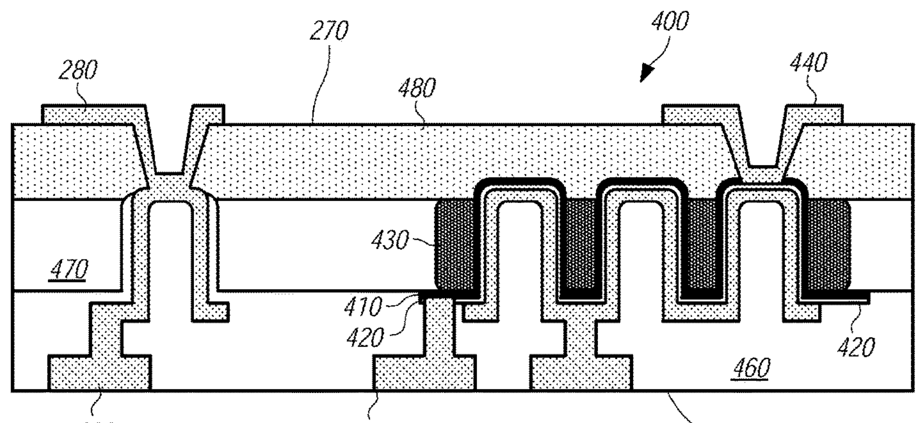
FIG. 5 is a block diagram illustrating an embodiment of a double-sided integrated silicon trench capacitor.

Integrated passive devices may include, for example, capacitors. FIG. 5 is a block diagram illustrating an embodiment of a double-sided integrated silicon trench capacitor 400. In some embodiments, trench capacitor 400 may include a conductive layer 410 (e.g., formed from a titanium nitride, metal silicide, or for example any reflective metal). The trench capacitor may include an insulation layer 420 substantially adjacent the conductive layer. In some embodiments, the layers 410, 420 may be positioned in a dopant 430. The trench capacitor 400 may include electrical conductors which electrically couple the first side 270 to the second side 260 of the trench capacitor 400. The trench capacitor 400 may include at least a fourth electrical conductor 290 positioned on the second side 260 of the trench capacitor 400. A die, for example, may be electrically connected to the fourth electrical conductor 290 using, for example, the second set of electrical conductors (not depicted in FIG. 5). The third electrical conductor 280 may be available to be electrically connected to a second device using at least one of the first set of electrical conductors (not depicted in FIG. 5). Conductors 440, 450 (e.g., formed from metal (e.g. copper, aluminum, titanium, or alloys thereof) or doped polysilicon) may function to electrically connect the trench capacitor 400. In some embodiments, the trench capacitor 400 may be formed from several layers, including an insulator layer 460 (e.g., formed from an oxide), a substrate layer 470 (e.g., formed from bulk silicon), and an isolation layer 480 (e.g., formed from a polymer, an oxide, etc.).

In some embodiments, a method may include forming trench capacitor 400. A silicon wafer may be etched to form openings or trenches in the silicon wafer. An insulator layer may be applied to the surface of the silicon wafer including the trenches. Portions of the insulator may be specifically removed as necessary (e.g., from the trenches). A doped material layer may be applied to the trenches. A conductive layer and an insulator layer may be successively applied to the surface of the silicon wafer including the trenches. Portions of the conductive layer and the insulator layer may be specifically removed as necessary (e.g., everywhere except from the trenches used to form the capacitor). A metal layer may be applied to at least the trenches as well as other electrical conductors as necessary. An insulator may be applied to fill the trenches and the surface of the silicon wafer including the trenches. Conductors may be built into the insulator layer at least electrically coupling to the trench capacitor. Portions of the silicon wafer may be removed from the surface opposite to the surface comprising the trenches (e.g., such that at least a portion of the conductive layer of the trench capacitor is exposed). An isolation layer may then be applied to the silicon surface which was previously ground down. Conductors or contacts may then be formed in the isolation layer such that at least one of the conductors is electrically coupled to the applied conductive layer of the trench capacitor.

Figure 6:
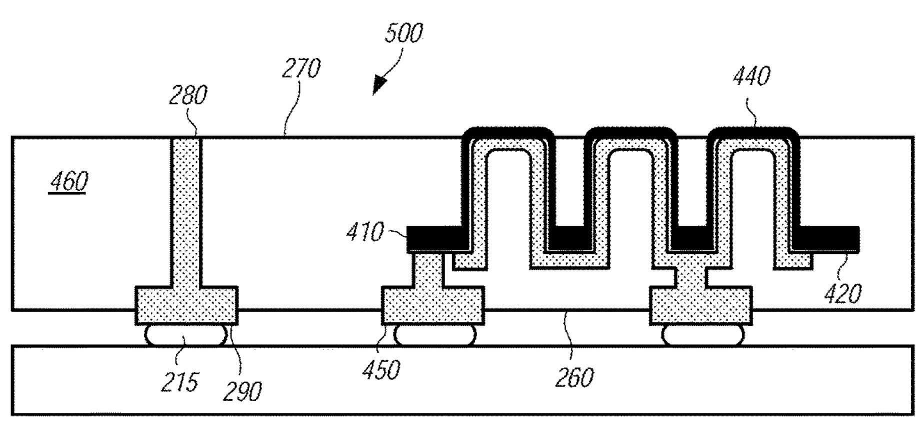
FIG. 6 is a block diagram illustrating an embodiment of a double-sided integrated isolation trench capacitor.

FIG. 6 is a block diagram illustrating an embodiment of a double-sided integrated isolation trench capacitor 500. In some embodiments, trench capacitor 500 may include a conductive layer 410 (e.g., formed from a titanium nitride, metal silicide, or for example any reflective metal). The trench capacitor may include an insulation layer 420 substantially adjacent the conductive layer. The trench capacitor 500 may include electrical conductors which electrically couple the first side 270 to the second side 260 of the trench capacitor 500. The trench capacitor 500 may include at least a fourth electrical conductor 290 positioned on the second side 260 of the trench capacitor 500. A die, for example, may be electrically connected to the fourth electrical conductor 290 using, for example, the second set of electrical conductors 215. The third electrical conductor 280 may be available to be electrically connected to a second device using at least one of the first set of electrical conductors (not depicted in FIG. 6). Conductors 440, 450 (e.g., formed from metal, doped polysilicon) may function to electrically connect the trench capacitor 500. In some embodiments, the trench capacitor 500 may be formed from an insulator layer 460 (e.g., formed from an oxide). In some embodiments, insulator layer 460 may be removed enough such that at least a portion of conductive layer 410 is exposed such that the portion functions as a conductor (e.g., conductor 440).

Figure 7:
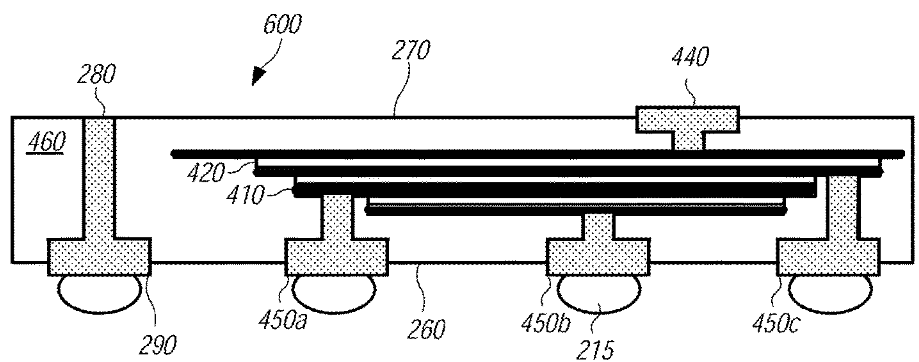
FIG. 7 is a block diagram illustrating an embodiment of a double-sided integrated isolation multilayer capacitor.

FIG. 7 is a block diagram illustrating an embodiment of a double-sided integrated isolation multilayer capacitor 600. The multilayer capacitor 600 may include multiple alternating conductive layers and insulating layers. The multilayer capacitor 600 may allow different levels of capacitance to be achieved using a single multilayer capacitor (e.g., by accessing different layers of the multilayer capacitor). In some embodiments, multilayer capacitor 600 may include a conductive layer 410 (e.g., formed from a titanium nitride, metal silicide, or for example any reflective metal). The multilayer capacitor may include an insulation layer 420 substantially adjacent the conductive layer 410. The multilayer capacitor 600 may include electrical conductors which electrically couple the first side 270 to the second side 260 of the multilayer capacitor 600. The multilayer capacitor 600 may include at least a fourth electrical conductor 290 positioned on the second side 260 of the multilayer capacitor 600. A die, for example, may be electrically connected to the fourth electrical conductor 290 using, for example, the second set of electrical conductors 215. The third electrical conductor 280 may be available to be electrically connected to a second device using at least one of the first set of electrical conductors (not depicted in FIG. 7). Conductors 440, 450*a-c* (e.g., formed from metal, doped polysilicon) may function to electrically connect the multilayer capacitor 600. In some embodiments, the multilayer capacitor 600 may be formed from an insulator layer 460 (e.g., formed from an oxide).

Integrated passive devices may include for example inductors. Inductors typically include a passive two-terminal electrical component which resists changes in electric current passing through it. Inductors consist of a conductor such as a wire, usually wound into a coil. When a current flows through the inductor, energy is stored temporarily in a magnetic field in the coil. When the current flowing through an inductor changes, the time-varying magnetic field induces a voltage in the conductor which opposes the change in current that created it. As a result, inductors always oppose a change in current. One should not confuse this with the resistance provided by a resistor.

An inductor is characterized by its inductance, the ratio of the voltage to the rate of change of current, which has units of henries (H).

Figure 8:
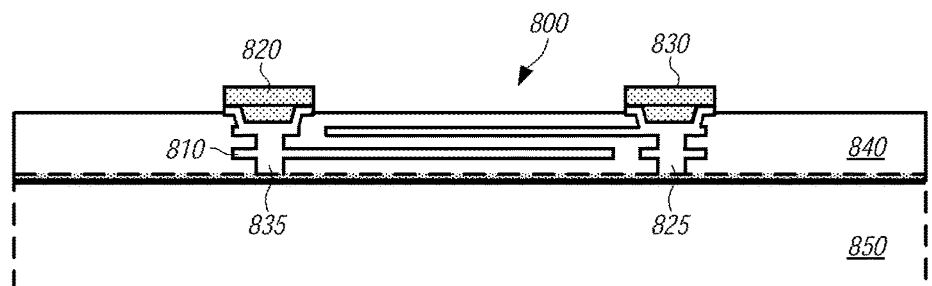
FIG. 8 is a block diagram illustrating a side view of an embodiment of a thin film inductor wafer.
Figure 9:
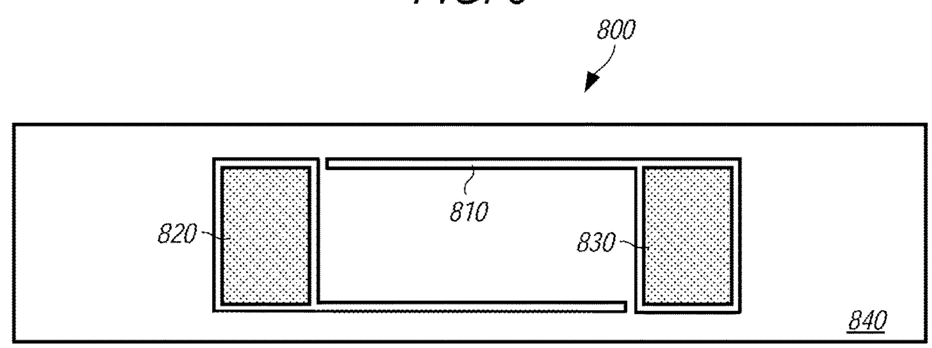
FIG. 9 is a block diagram illustrating a top view of an embodiment of a thin film inductor wafer.

FIGS. 8-9 are block diagrams illustrating a side view and a top view respectively of an embodiment of a thin film inductor wafer 800. In some embodiments, the inductor wafer 800 may include a conductor 810. In some embodiments, the conductor 810 may be formed into a shape of a coil (i.e., FIGS. 8-9 depict a coiled conductor 810 wherein in FIG. 9 one is looking down through the center of the coil). The coil may be formed by depositing multiple alternating layers of conducting and insulating materials. Conductors 820, 825, 830, 835 (e.g., formed from metal, doped polysilicon) may function to electrically connect the multilayer capacitor 800. In some embodiments, the inductor wafer 800 may be formed from an insulator layer 840 (e.g., formed from an oxide) on a base 850 (e.g., silicon wafer). In some embodiments, base 850 may be used for manufacture of the inductor wafer 800 and as such most if not all of the base 850 may be removed after manufacture. Removal of base 850 may result in exposure of conductors 825, 835. In some embodiments, conductors 820 and 825 may be paired and or 830 and 835 may be paired. In some embodiments, a conductor (e.g., 820) may be paired with another conductor (e.g., 825) to electrically couple inductor 800, while a third conductor (e.g., 830) may be only used as a structural contact/support for the inductor 800.

Figure 10:
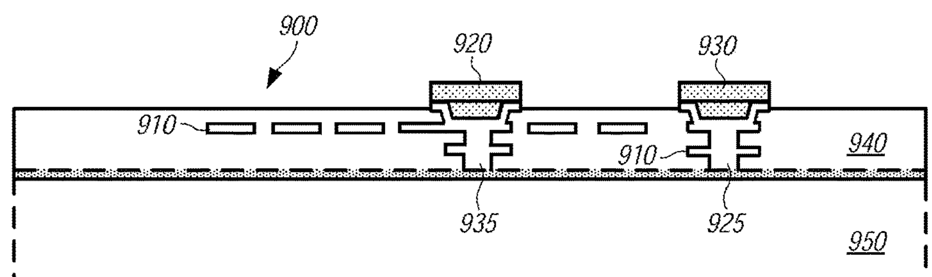
FIG. 10 is a block diagram illustrating a side view of an embodiment of a thin film inductor wafer.
Figure 11:
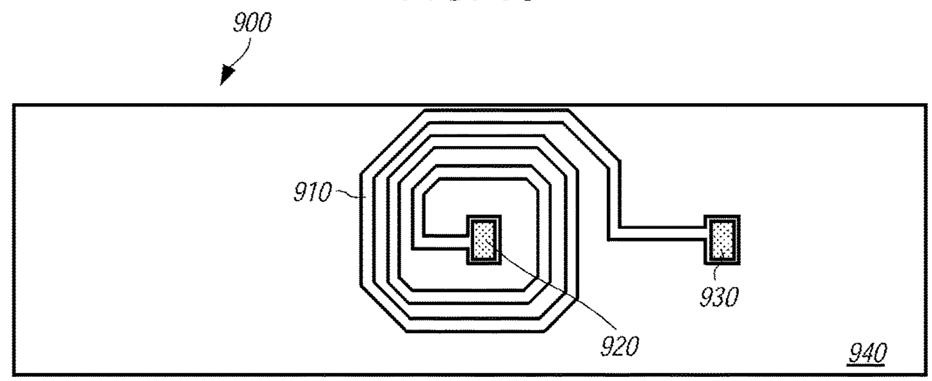
FIG. 11 is a block diagram illustrating a top view of an embodiment of a thin film inductor wafer.

FIGS. 10-11 are block diagrams illustrating a side view and a top view respectively of an embodiment of a thin film inductor wafer 900. In some embodiments, the inductor wafer 900 may include a conductor 910. In some embodiments, the conductor 910 may be formed into a shape of a coil (i.e., FIGS. 10-11 depict a coiled conductor 910 wherein in FIG. 11 one is looking down through the center of the coil). The coil may be formed by depositing multiple layers with for example one layer including the conductor 910 such that the coiled conductor is positioned in a single plane. Conductors 920, 925, 930, 935 (e.g., formed from metal, doped polysilicon) may function to electrically connect the multilayer capacitor 900. In some embodiments, the inductor wafer 900 may be formed from an insulator layer 940 (e.g., formed from an oxide) on a base 950 (e.g., silicon wafer). In some embodiments, base 950 may be used for manufacture of the inductor wafer 900 and as such most if not all of the base 950 may be removed after manufacture. Removal of base 950 may result in exposure of conductors 925, 935. In some embodiments, conductors 920 and 925 may be paired and or 930 and 935 may be paired. In some embodiments, a conductor (e.g., 920) may be paired with another conductor (e.g., 925) to electrically couple inductor 900, while a third conductor (e.g., 930) may be only used as a structural contact/support for the inductor 900.

Figure 12:
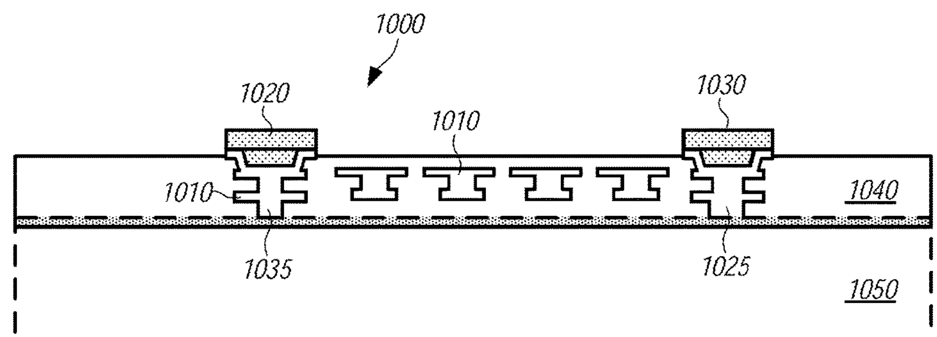
FIG. 12 is a block diagram illustrating a side view of an embodiment of a thin film inductor wafer.
Figure 13:
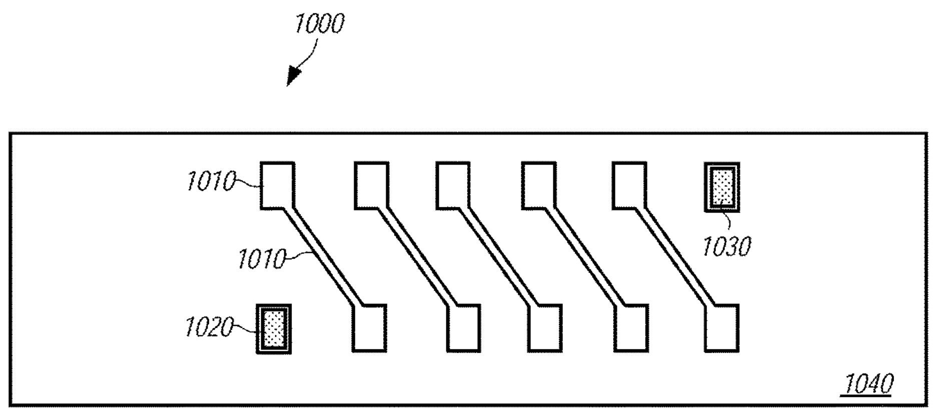
FIG. 13 is a block diagram illustrating a top view of an embodiment of a thin film inductor wafer.

FIGS. 12-13 are block diagrams illustrating a side view and a top view respectively of an embodiment of a thin film inductor wafer 1000. In some embodiments, the inductor wafer 1000 may include a conductor 1010. In some embodiments, the conductor 1010 may be formed into a shape of a coil (i.e., FIGS. 12-13 depict a coiled conductor 1010 wherein in FIG. 13 one is looking down at the top of the coil). The coil may be formed by depositing multiple alternating layers of conducting and insulating materials. Conductors 1020, 1025, 1030, 1035 (e.g., formed from metal, doped polysilicon) may function to electrically connect the multilayer capacitor 1000. In some embodiments, the inductor wafer 1000 may be formed from an insulator layer 1040 (e.g., formed from an oxide) on a base 1050 (e.g., silicon wafer). In some embodiments, base 1050 may be used for manufacture of the inductor wafer 1000 and as such most if not all of the base 1050 may be removed after manufacture. Removal of base 1050 may result in exposure of conductors 1025, 1035. In some embodiments, conductors 1020 and 1025 may be paired and or 1030 and 1035 may be paired. In some embodiments, a conductor (e.g., 1020) may be paired with another conductor (e.g., 1025) to electrically couple inductor 1000, while a third conductor (e.g., 1030) may be only used as a structural contact/support for the inductor 1000.

Figure 14A:
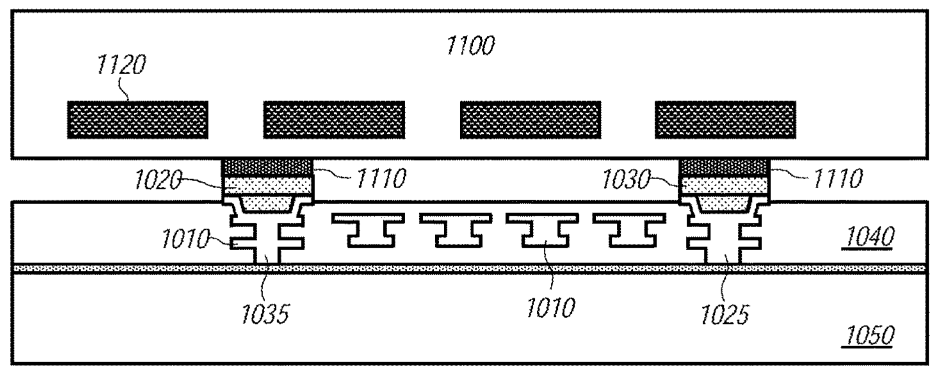
FIGS. 14A-B are block diagrams illustrating an embodiment of bonding a thin film inductor wafer to a CMOS wafer.
Figure 14B:
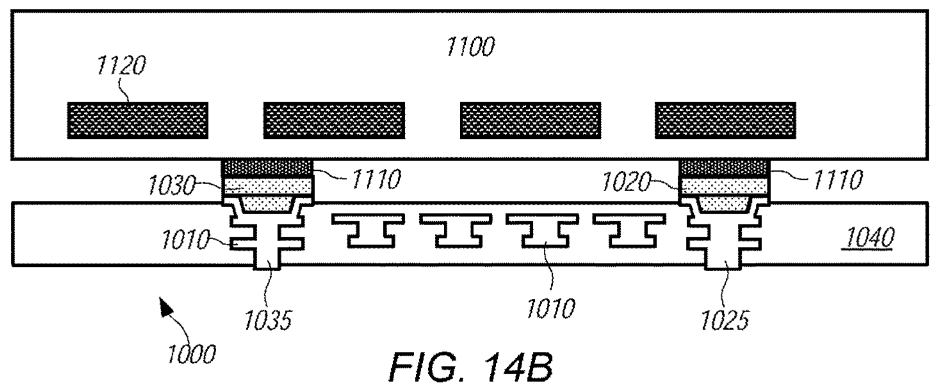

In some embodiments, base 850, 950, 1050 may be used for manufacturing purposes and as such may be removed at a later time. For example, the inductor wafer may be coupled to an active wafer. FIGS. 14A-B are block diagrams illustrating an embodiment of bonding a thin film inductor 1050 to an active wafer 1100 or integrated circuit (e.g., a Complementary metal-oxide-semiconductor (CMOS) wafer). Electrical conductors 1110 may couple active wafer 1100 (and any devices 1120) to thin film inductor 1050. In some embodiments, upon bonding active wafer 1100 to thin film inductor 1050 much or all of base 1050 may be removed (e.g., ground off) resulting in the exposure of conductors 1035 and 1025.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. An integrated circuit, comprising: a substrate including a first surface, a second surface substantially opposite of the first surface, and a first set of electrical conductors coupled to the first surface configured to electrically connect the integrated circuit to a circuit board; a semiconductor die coupled to the second surface of the substrate using a second set of electrical conductors; and a passive device integrated in the integrated circuit, wherein the passive device is positioned between the first surface and the second surface of the substrate, the passive device comprises a thin film inductor comprising a coiled inductor coupled to at least two conductors, and wherein a majority of the coiled inductor lies within a single plane;

the passive device comprises at least a third electrical conductor positioned on a first side of the passive device, wherein the passive device comprises at least a fourth electrical conductor positioned on a second side of the passive device, and wherein the second side of the device is positioned opposite the first side of the device;

wherein the passive device is coupled to the first surface of the substrate using the third electrical conductor and the passive device is coupled to the semiconductor die using the fourth electrical conductor and the second set of electrical conductors.

2. The integrated circuit of claim 1, wherein the passive device is embedded in the substrate.

3. The integrated circuit of claim 1, wherein the passive device is incapable of controlling current by means of another electrical signal.

4. The integrated circuit of claim 1, further comprising a capacitor.

5. The integrated circuit of claim 4, wherein the capacitor comprises a multilayer capacitor.

6. The integrated circuit of claim 5, wherein the multilayer capacitor allows different levels of capacitance to be achieved using a single multilayer capacitor.

7. The integrated circuit of claim 5, wherein the multilayer capacitor comprises alternating conductive layers and insulating layers.

8. The integrated circuit of claim 1, wherein the substrate further include conductors to connect the second surface of the substrate to the first surface of the substrate and devices coupled to the first and second surfaces.

9. The integrated circuit of claim 1, wherein the passive device further includes conductors to connect the second surface of the substrate to the first surface of the substrate.

10. A method of manufacturing an integrated circuit, comprising: coupling a first set of electrical conductors to a first surface of a substrate, wherein the first set of electrical conductors electrically connect the integrated circuit to a circuit board, and wherein the substrate includes a second surface substantially opposite of the first surface; coupling a semiconductor die to the second surface of the substrate using a second set of electrical conductors; integrating a passive device into the integrated circuit, wherein the passive device is positioned between the first surface and the second surface of the substrate, the passive device comprises a thin film inductor comprising a coiled inductor coupled to at least two conductors, and wherein a majority of the coiled inductor lies within a single plane, coupling the passive device to the first surface of the substrate using a third electrical conductor positioned on a first side of the passive device; and coupling the passive device to the semiconductor die using a fourth electrical conductor positioned on a second side of the passive device and the second set of electrical conductors.

11. The method of claim 10, wherein the passive device is incapable of controlling current by means of another electrical signal.

12. The method of claim 10, further comprising integrating an inductor into the integrated circuit.

13. The method of claim 12, wherein integrating the inductor into the integrated circuit comprises integrating a multilayer capacitor into the integrated circuit.

14. The method of claim 13, wherein integrating the multilayer capacitor into the integrated circuit comprises integrating a multilayer capacitor allowing different levels of capacitance to be achieved using a single multilayer capacitor.

* * * * *